(12) United States Patent
Okamoto et al.

(10) Patent No.: US 10,115,857 B2
(45) Date of Patent: Oct. 30, 2018

(54) METHOD FOR MANUFACTURING SEMICONDUCTOR ELEMENT OF POLYGON SHAPE

(71) Applicant: NICHIA CORPORATION, Anan-shi, Tokushima (JP)

(72) Inventors: Hiroki Okamoto, Tokushima (JP); Hiroaki Tamemoto, Anan (JP); Junya Narita, Yoshinogawa (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/196,787

(22) Filed: Jun. 29, 2016

(65) Prior Publication Data

US 2017/0005225 A1    Jan. 5, 2017

(30) Foreign Application Priority Data

Jun. 30, 2015   (JP) .................................. 2015-131776

(51) Int. Cl.

| H01L 21/00 | (2006.01) |
|---|---|
| H01L 33/00 | (2010.01) |
| H01L 21/78 | (2006.01) |
| H01L 21/304 | (2006.01) |
| H01L 21/683 | (2006.01) |
| H01L 29/04 | (2006.01) |

(52) U.S. Cl.
CPC ........ *H01L 33/0095* (2013.01); *H01L 21/304* (2013.01); *H01L 21/6835* (2013.01); *H01L 21/78* (2013.01); *H01L 29/04* (2013.01); *H01L 2221/68327* (2013.01)

(58) Field of Classification Search
CPC .......................... H01L 33/0095; H01L 21/304
USPC ........................................................ 438/464
See application file for complete search history.

(56) References Cited

U.S. PATENT DOCUMENTS

| 6,030,885 | A  | * | 2/2000  | Bothra  | ..................... | H01L 21/78 |
|---|---|---|---|---|---|---|
|           |    |   |         |         |                      | 257/E21.599 |
| 8,318,518 | B2 | * | 11/2012 | Hoshino | ............... | H01L 33/007 |
|           |    |   |         |         |                      | 257/98 |
| 9,136,173 | B2 | * | 9/2015  | Grivna  | ..................... | H01L 21/78 |
| 9,385,041 | B2 | * | 7/2016  | Carney  | ................... | H01L 21/78 |

(Continued)

FOREIGN PATENT DOCUMENTS

| JP | S63-009950 A | 1/1988 |
|---|---|---|
| JP | H10-074712 A | 3/1998 |

(Continued)

*Primary Examiner* — Caleb Henry
(74) *Attorney, Agent, or Firm* — Hunton Andrews Kurth LLP

(57) ABSTRACT

A method for manufacturing a semiconductor element is provided. The method includes providing a semiconductor wafer including a substrate and a semiconductor structure on the substrate, forming a cleavage starting portion in the semiconductor wafer, and dividing the semiconductor wafer into a plurality of semiconductor elements by transferring a pressing member on the semiconductor wafer in a state where the pressing member is pressed against the semiconductor wafer to separate the semiconductor wafer at the cleavage starting portion. The pressing member includes a tip portion to be pressed on the semiconductor wafer, and the tip portion has a spherical surface.

17 Claims, 10 Drawing Sheets

(56) References Cited

U.S. PATENT DOCUMENTS

| | | | |
|---|---|---|---|
| 9,418,894 B2* | 8/2016 | Grivna | H01L 21/78 |
| 9,484,260 B2* | 11/2016 | Grivna | H01L 21/78 |
| 9,680,049 B2* | 6/2017 | Plo.beta.l | H01L 33/007 |
| 2004/0241962 A1 | 12/2004 | Nagai | |
| 2004/0266094 A1 | 12/2004 | Nagai et al. | |
| 2007/0148803 A1 | 6/2007 | Yakushiji et al. | |
| 2007/0290299 A1 | 12/2007 | Sakamoto et al. | |
| 2011/0287608 A1 | 11/2011 | Saegusa et al. | |
| 2011/0298084 A1 | 12/2011 | Tamemoto | |
| 2015/0064824 A1 | 3/2015 | Fukaya | |
| 2015/0217400 A1 | 8/2015 | Yamada | |

FOREIGN PATENT DOCUMENTS

| | | |
|---|---|---|
| JP | 2003-017443 A | 1/2003 |
| JP | 2004-349623 A | 12/2004 |
| JP | 2005-019769 A | 1/2005 |
| JP | 2005-353946 A | 12/2005 |
| JP | 2006-135309 A | 5/2006 |
| JP | 2007-220703 A | 8/2007 |
| JP | 2007-317935 A | 12/2007 |
| JP | 2010-177395 A | 8/2010 |
| JP | 2012-124300 A | 6/2012 |
| JP | 2013-247147 A | 12/2013 |
| JP | 2014-041925 A | 3/2014 |
| JP | 2014-078606 A | 5/2014 |
| JP | 2014-135376 A | 7/2014 |
| JP | 2015-050415 A | 3/2015 |
| WO | 2005/098915 A1 | 10/2005 |
| WO | 2010/098186 A1 | 9/2010 |

* cited by examiner

METHOD FOR MANUFACTURING SEMICONDUCTOR ELEMENT OF POLYGON SHAPE

CROSS-REFERENCE TO RELATED APPLICATION

This application claims the benefit of Japanese Patent Application No. 2015-131776 filed on Jun. 30, 2015. The entire disclosure of Japanese Patent Application No. 2015-131776 is incorporated by reference herein.

BACKGROUND

Technical Field

The present disclosure relates to a method for manufacturing a semiconductor element.

Description of Related Art

Light-emitting elements have been widespread as various light sources. In particular, semiconductor light-emitting elements typified by light-emitting diodes (LED) or laser diodes (LD) have advantages such as reduction in size, low power consumption, and a long life, and thus have achieved great proliferation. The semiconductor light-emitting elements are generally manufactured through steps in which, after a semiconductor layer is grown on a growth substrate, a semiconductor wafer obtained is cleaved (e.g., by scribing and breaking) into chips.

Break blades have been known as members for pressing the semiconductor wafer in the breaking described above. The break blades are formed, for example, in a size of which the break blades can traverse the semiconductor wafer. In the case where LED chips (dice), which are light-emitting elements cleaved from the semiconductor wafer, are to be formed to have a rectangular shape, a scribe line is formed in a straight line and the semiconductor wafer can be broken by use of the break blades.

However, for example, in the case where the light-emitting elements are to be formed in a hexagonal shape, the scribe line is bent in the semiconductor wafer. In this case, if a cleaving member that linearly cleaves the semiconductor wafer, such as the break blade, is used, pressing against the wafer at portions except for the scribe line may damage the light emitting element. In the case where the break blade is pressed against the semiconductor wafer, there is no choice but to provide a damage area in advance and linearly cleave the semiconductor wafer, or to carefully position a small blade, of which the size is the same as that of the light-emitting element. In any case, operations become so complicated. Thus, in the case where the shape of the light-emitting elements is not rectangular, it takes time to position the blade during a cleaving operation, which may cause a disadvantage in manufacturing. See Japanese Unexamined Patent Application Publication No. H10-074712, Japanese Unexamined Patent Application Publication No. 2006-135309, Japanese Unexamined Patent Application Publication No. 2004-349623, and Japanese Unexamined Patent Application Publication No. 2012-124300.

One of the objects of the present disclosure is to provide a method for manufacturing a semiconductor element, which is suitable for manufacturing a semiconductor element such as a light-emitting element having in a non-rectangular shape.

SUMMARY

According to an embodiment of the present disclosure, a method is provided for manufacturing a semiconductor element having a shape of a polygon having five or more angles in a plan view. The method includes providing a semiconductor wafer including a substrate and a semiconductor structure on the substrate, forming a cleavage starting portion in the semiconductor wafer, and dividing the semiconductor wafer into a plurality of semiconductor elements by transferring a pressing member on the semiconductor wafer in a state where the pressing member is pressed against the semiconductor wafer to separate the semiconductor wafer at the cleavage starting portion. The pressing member includes a tip portion having a curved surface to be pressed on the semiconductor wafer.

According to the aforementioned embodiment, even in the case of polygonal semiconductor elements, it is possible to efficiently cleave the semiconductor wafer.

DETAILED DESCRIPTION

First, the outline of a light-emitting element 10 obtained by a manufacturing method according to the embodiment of the present disclosure will be described. The light-emitting element 10 is one example of a semiconductor element.

Figure 1:
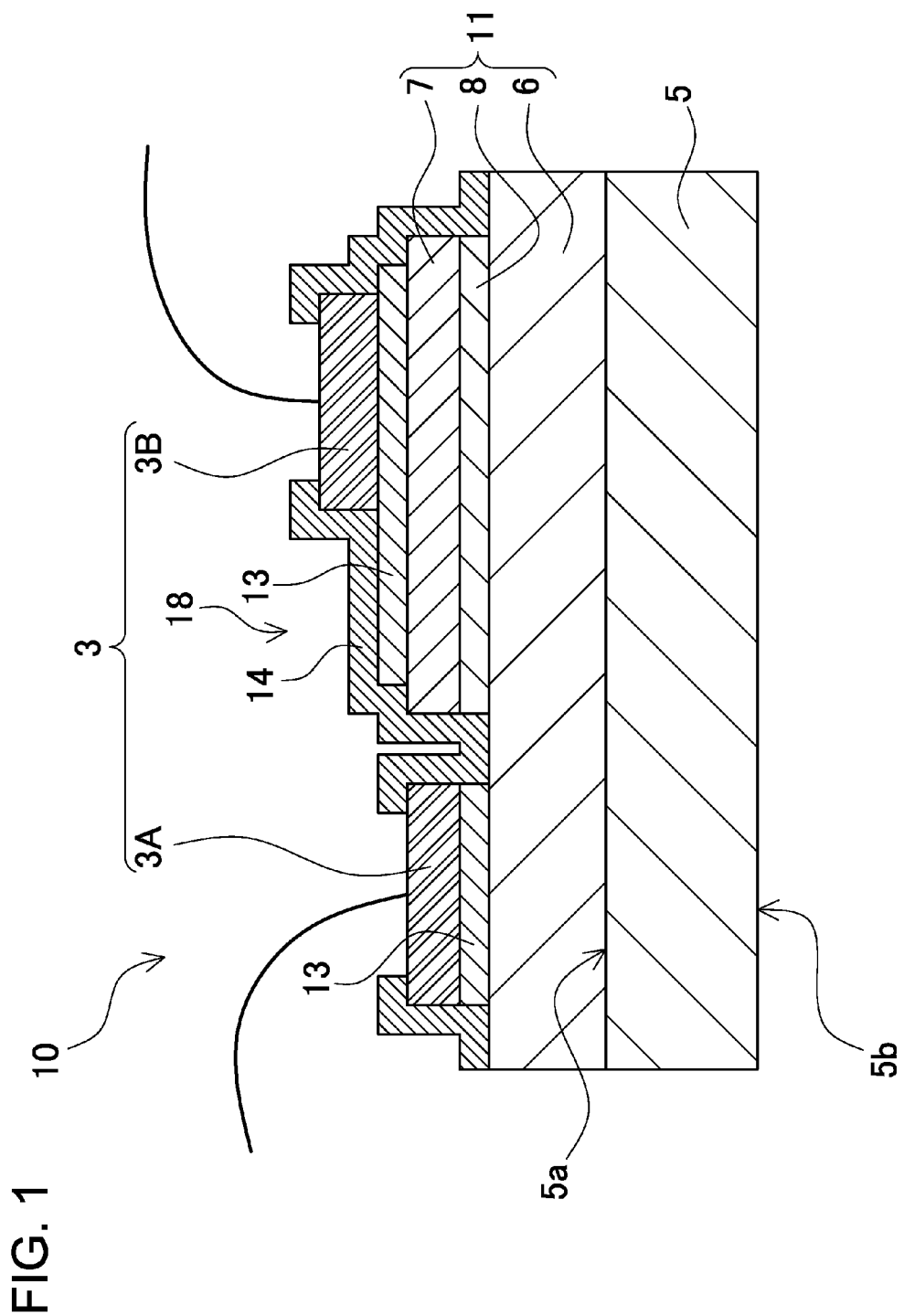
FIG. 1 is a schematic cross-sectional view illustrating a light-emitting element according to a first embodiment.

FIG. 1 illustrates the cross section of the light-emitting element 10. As illustrated in FIG. 1, in the light-emitting element 10, nitride semiconductor layers that serve as a semiconductor structure 11 are stacked on a first main surface 5a, which is one main surface of a substrate 5. More specifically, in the light-emitting element 10, the semiconductor structure 11 that includes an n-side semiconductor layer as a first conductive side semiconductor layer 6, an active layer 8, and a p-side semiconductor layer as a second conductive side semiconductor layer 7 is stacked in this order on side of a front surface, which is the first main surface 5a of the substrate 5 including a pair of main surfaces opposite to each other. Also, an n-side pad electrode 3A is electrically connected to the n-side semiconductor layer, and a p-side pad electrode 3B is electrically connected to the p-side semiconductor layer. When power is supplied from outside to the light-emitting element 10 via the n-side pad electrode 3A and the p-side pad electrode 3B, light is emitted from the active layer 8, and the light is mainly extracted from the second conductive side semiconductor layer 7 in FIG. 1. That is, in the light-emitting element 10 in FIG. 1, a side of a surface on which a pair of positive and negative electrodes 3 (inclusive of the n-side pad electrode 3A and the p-side pad electrode 3B) are formed (i.e., upper side in FIG. 1) serves as a main light extraction surface 18. The active layer 8 corresponds to a light emission layer. The central wavelength of light emitted from the active layer 8 is in a range of, for example, from 360 nm to 650 nm.

Also, light-transmissive conductive layers 13 are respectively formed on the n-side semiconductor layer and the p-side semiconductor layer, and the n-side pad electrode 3A and the p-side pad electrode 3B are respectively formed on the light-transmissive conductive layers 13. Furthermore, only predetermined portions of surfaces of the n-side pad electrode 3A and the p-side pad electrode 3B are exposed from a protective film 14 having insulation properties, and other portions of the surfaces are covered with the protective film 14.

The substrate 5 is made of, for example, sapphire, and the semiconductor structure 11 is made of, for example, nitride semiconductors such as GaN. Also, the light-transmissive conductive layers 13 may be omitted. The light-emitting element 10 illustrated in FIG. 1 is a so-called face-up type light-emitting element in which the side of second conductive side semiconductor layer 7 serves as the light extraction surface, and the side of the second main surface 5b serves as a mounting surface. A light-emitting element may be manufactured to be a so-called face-down type light-emitting element in which the side of the second main surface 5b serves as the light extraction surface, and the side of second conductive side semiconductor layer 7 serves as the mounting surface.

Method for Manufacturing Light-Emitting Element According to First Embodiment

Hereinafter, the method for manufacturing the light-emitting element 10 above will be described referring to a flowchart in FIG. 2 and FIGS. 3 to 9.

Providing Semiconductor Wafer

Figure 2:
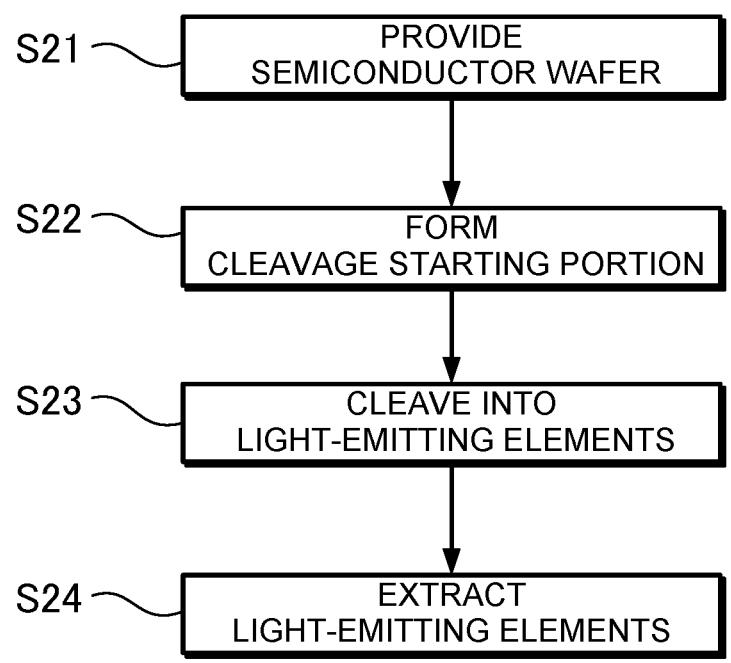
FIG. 2 is a schematic flowchart illustrating a method for manufacturing the light-emitting element in FIG. 1.
Figure 3:
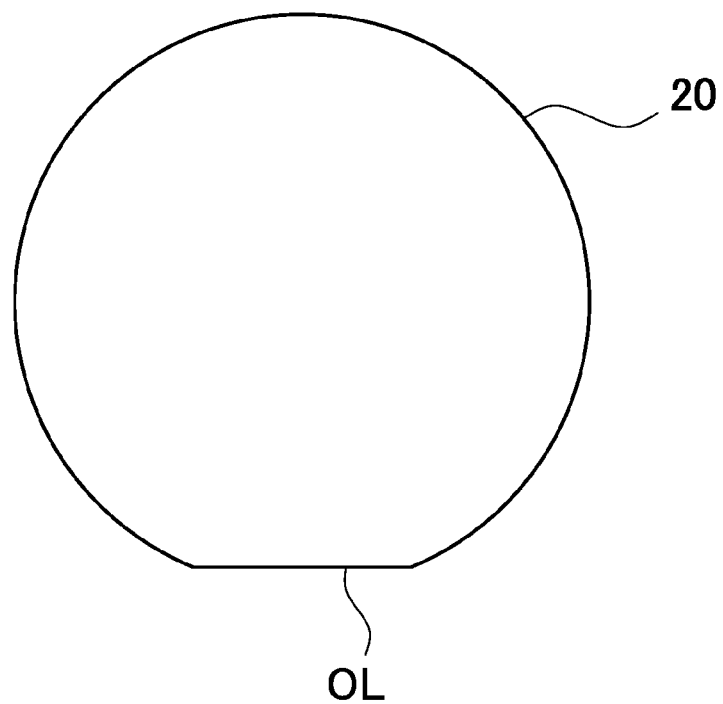
FIG. 3 is a schematic plan view illustrating a semiconductor wafer.

First, a semiconductor wafer is provided at Step S21 in FIG. 2. As illustrated in FIG. 3, a semiconductor wafer 20 has an approximately circular shape in a plan view, and includes an orientation flat surface OL at a portion thereof. The semiconductor wafer 20 includes the substrate 5 and the semiconductor structure 11 arranged on the substrate 5. The diameter of the semiconductor wafer 20 can be in a range of, for example, approximately 50 to 100 mm. Also, the number of light-emitting elements obtained from one semiconductor wafer is in a range of, for example, approximately 1500 to 200000.

Forming Cleavage Starting Portion 22

Figure 4:
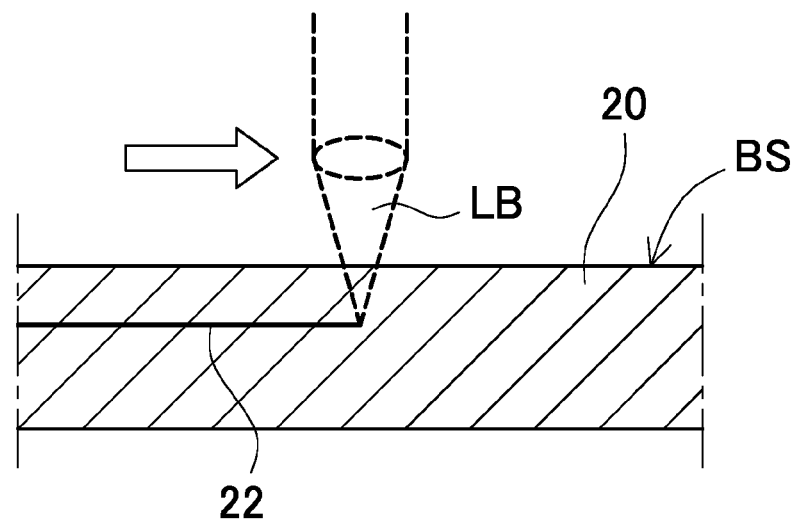
FIG. 4 is a schematic cross-sectional view illustrating an example in which a laser beam is irradiated to an interior of the semiconductor wafer to perform laser scribing.

Next, a cleavage starting portion 22 is formed in the semiconductor wafer 20 at Step S22 in FIG. 2. The cleavage starting portion 22 is a portion that serves as a guide for facilitating the cleavage of the semiconductor wafer 20 in order to divide the semiconductor wafer 20 into pieces each having a predetermined size to obtain the light-emitting elements, and typically corresponds to the scribe line. However, the cleavage starting portion 22 is not required to be a continuous straight form; the cleavage starting portion 22 can be constituted of patterns of a wavy form or discrete patterns such as a dotted form. Also, the cleavage starting portion 22 includes a fragile area formed in the interior of the semiconductor wafer, in addition to grooves physically formed in a surface of the semiconductor wafer. Preferably, the cleavage starting portion 22 is formed by irradiating a laser beam. A cross-sectional view of FIG. 4 illustrates an example in which a laser beam LB is irradiated to the interior of the semiconductor wafer 20 to perform laser scribing. According to such laser scribing, the laser beam is scanned on the semiconductor wafer 20, so that the cleavage starting portion 22 can be formed in a desired pattern. It is noted that, while the cleavage starting portion 22 is represented as a line existing in the interior of the semiconductor wafer 20 in FIG. 4, normally, it is considered that the cleavage starting portion 22 is generated only in the interior (only in the vicinity of convergence position of a laser beam) of the semiconductor wafer 20 immediately after the laser beam is irradiated, and that a crack is gradually expanded in a thickness direction (i.e., up-and-down direction) of the wafer, starting from the cleavage starting portion 22.

Also, the cleavage starting portion 22 may be provided on both surfaces of the semiconductor wafer, and preferably, formed so as to reach a surface opposite to a surface on which the semiconductor structure is formed, that is, a back surface (a second main surface 5b) of the substrate 5. This formation has an advantage such that the cleavage of the semiconductor wafer can be easily performed. Also, arranging the portion on which the laser beam focused to be away from the semiconductor structure 11 can avoid a situation in which the semiconductor structure 11 (in particular, the active layer 8) is damaged by the laser beam. Specifically, as illustrated in the cross-sectional view in FIG. 4, the laser beam is irradiated from the side of a back surface BS of the semiconductor wafer 20 (substrate 5), so that the cleavage starting portion 22 is formed.

Preferably, with use of the laser beam having wavelengths that can penetrate the substrate 5, the cleavage starting portion 22 is formed by focusing the laser beam in the interior of the substrate 5. The substrate 5 is, for example, a sapphire substrate, and examples of the energy per pulse (pulse energy), the frequency, the pulse width, and the wavelength of the laser beam are in ranges of 0.8 to 5 μJ, 50 to 200 kHz, 300 to 50000 fs (femtosecond), and 500 to 1100 nm, respectively. When the laser beam is irradiated to the interior of the substrate 5 with pulse drive, the crack is expanded from a portion on which the laser beam is focused or in the vicinity of the portion on which the laser beam is focused. For example, the portion on which the laser beam is focused is set close to the side of the back surface (the side of the second main surface 5b) of the substrate 5, which causes the crack to reach the back surface of the substrate 5. Accordingly, when viewed from the side of the back surface of the substrate 5, it is possible that the crack is connected in almost all the paths on which the laser beam is scanned, but the crack does not reach the surface on the side opposite to the back surface (the side where the semiconductor structure 11 of the semiconductor wafer 20 is formed). Cleaving is performed with respect to the semiconductor wafer 20 in the aforementioned state, which allows for cleaving the semiconductor wafer 20 with accuracy.

It is preferable that the cleavage starting portion 22 be formed up to a portion near the semiconductor structure 11. For example, it is preferable that the cleavage starting portion 22, which is formed so as to reach the back surface BS of the substrate 5, extend in a depth direction (i.e., the thickness direction of the semiconductor wafer 20), and that one end of the cleavage starting portion 22 reaches the portion near the semiconductor structure 11. With this arrangement, the thickness of the portion to be cleaved in the cleaving can be reduced, thereby facilitating the cleaving. However, in the present disclosure, it is not necessary for all the cleavage starting portions to reach the portion near the semiconductor structure 11, and even in the case where a portion of the cleavage starting portion 22 does not reach the portion near the semiconductor structure 11, it is sufficient that the cleavage starting portion 22 be formed such that the cleavage is sufficiently performed. For example, a distance of the cleavage starting portion 22 from the semiconductor structure 11 is in a range of 0 to 10 μm. A portion of the cleavage starting portion 22 may penetrate the semiconductor structure 11 and reach the surface of the semiconductor wafer 20, but it is preferable that the cleavage starting portion 22 do not penetrate the semiconductor structure 11 until the cleaving is performed. This is because, if the semiconductor structure 11 is completely divided, the semiconductor wafer may be cut into the individual light-emitting elements and may be scattered before starting the cleaving. To which portion the cleavage starting portion 22 extends can be adjusted based on scribing conditions or waiting time subsequent to the scribing. Also, the portion on which the laser beam is irradiated in the interior of the substrate 5, for example, is located within 150 μm from the semiconductor structure 11.

The pattern of the cleavage starting portion 22 formed in the semiconductor wafer 20 defines the shape of the light-emitting elements to be obtained by the cleavage. Preferably, the shape of the light-emitting elements in a plan view is a polygon having five or more angles. Generally, the shape of the light-emitting elements is a quadrangle (typically, a square or rectangle). However, in view of combining a lens or the like and the light-emitting elements or in view of the emission area of output light, it can be considered that the shape of the light-emitting elements be preferably a circle. In the case where the light-emitting elements are circular, processing of the semiconductor wafer for the cleavage is difficult, and further, in the case where a plurality of circular light-emitting elements are cut out from the semiconductor wafer, unused regions are formed between the circular light-emitting elements adjacent to each other. Accordingly, the amount of light-emitting elements obtained from one semiconductor wafer, that is, an available area of the semiconductor wafer that can be used for light emitting elements is decreased, which may reduce yields. In view of this, in the case where the shape of plan view of the light-emitting elements is a polygon having five or more angles, the shape of the light-emitting elements in a plan view can be approximated to a circle while wasteful areas of the semiconductor wafer are reduced, so that improvements to obtain the output light of a higher quality can be expected.

Figure 5:
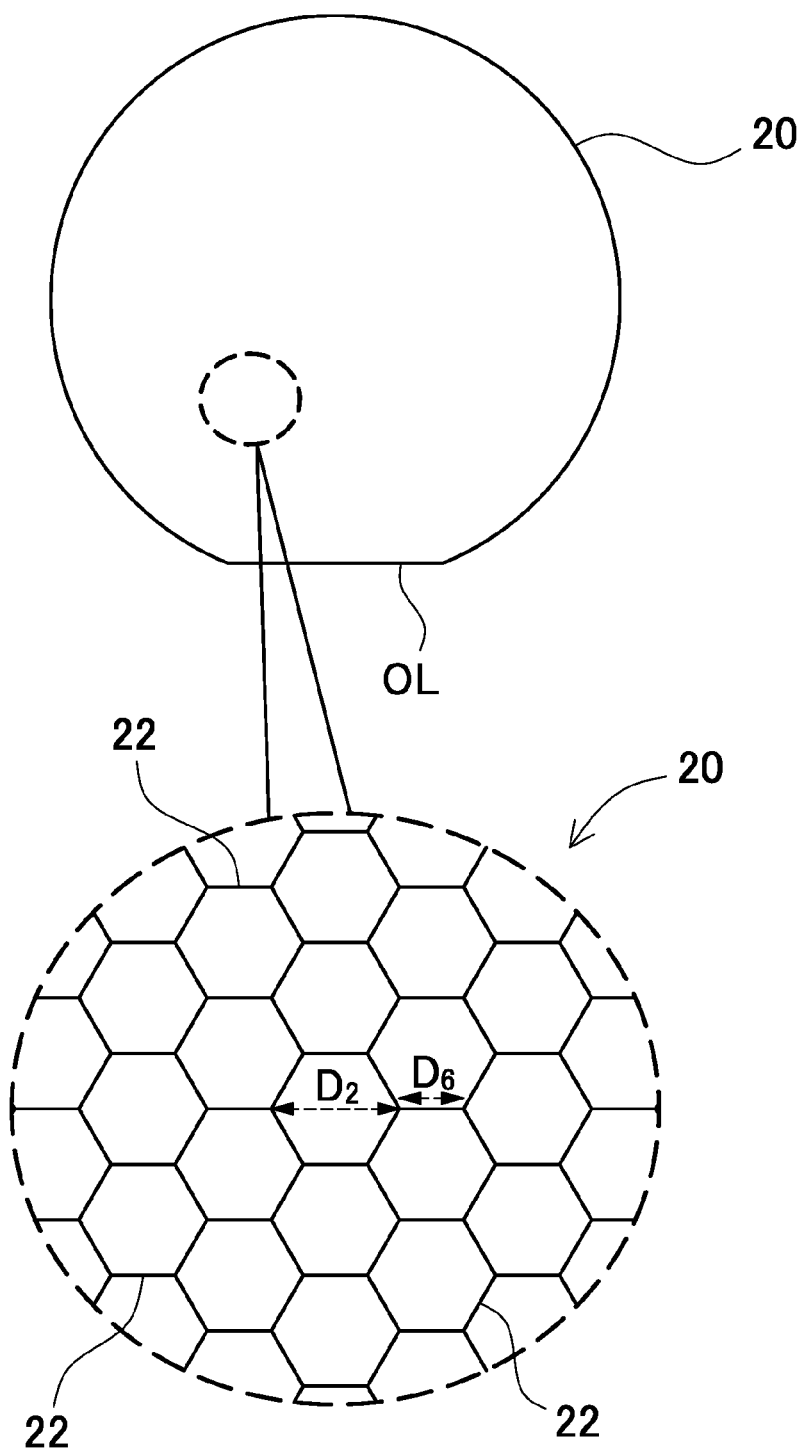
FIG. 5 is a schematic enlarged view of a main part illustrating an example in which a cleavage starting portion is formed in the semiconductor wafer in FIG. 3.

Preferably, as illustrated in FIG. 5, the patterns of the cleavage starting portion 22 are formed in the semiconductor wafer 20 so that the shape of each light-emitting element in a plan view is a hexagonal shape. Accordingly, the cleavage starting portion 22 is a polygonal line in a plan view of the semiconductor wafer 20. It is noted that, in the present disclosure, the patterns of the cleavage starting portion are not limited to the polygonal line, and a cleaving method described later can be applied to the cleavage starting portion formed in a straight line or curved line. In order to reduce the wasteful areas of the semiconductor wafer as much as possible, areas to be the light-emitting elements may be arranged in the wafer so as to allow tessellation. For example, the shape of the light-emitting elements in a plan view is formed in a regular hexagon whose one side has a length of $D_6$ and the regular hexagons are arranged in a honeycomb pattern.

In the case where the shape of the light-emitting elements in a plan view is a hexagon, it is preferable that the substrate 5 having the crystal structure having hexagonal crystal system be used. All the cleavage starting portions 22 may be formed along the cleavage plane (for example, m-plane of sapphire) of the substrate 5, or all the cleavage starting portions 22 may be formed so as to be shifted from the cleavage plane of the substrate 5. With this, cleavage properties of each side of the light-emitting element can be uniform. Examples of the substrate 5 having the crystal structure of hexagonal crystal system include, for example, a sapphire substrate and a GaN substrate. Normally, the easiness of cleaving the substrate 5 is approximately equal to the easiness of cleaving the semiconductor wafer 20, because most of the thickness of the semiconductor wafer 20 is occupied by the substrate 5. In the case where most of the thickness of the semiconductor wafer is occupied by members except for the substrate 5, such as the semiconductor structure, the members may be formed of materials having the crystal structure of hexagonal crystal system.

The cleavage starting portion 22 refers to a portion that serves as a starting point of the cleavage in the later-described step of cleaving into the light-emitting elements and indicates a crack generated in the semiconductor wafer before the step of cleaving. The cleavage starting portion 22 can be formed with cutter scribing, but laser scribing using the aforementioned laser beam is suitable for forming the cleavage starting portion having polygonal line patterns.

Cleaving into Light-Emitting Element

At Step S23 in FIG. 2, the semiconductor wafer 20 is cleaved with use of the cleavage starting portion 22 so as to cut the semiconductor wafer 20 into the individual light-emitting elements. More specifically, as illustrated in cross-sectional views in FIGS. 6 to 9, a pressing member 30 is transferred on the semiconductor wafer 20 while being pressed against the semiconductor wafer 20, and the semiconductor wafer 20 is divided on the cleavage starting portion 22 and cleaved into the individual light-emitting elements. A scanning controller 33 performs a transfer in the vertical direction, in which the pressing member 30 is moved upward and downward so that a tip portion 31 of the pressing member 30 contacts and separate from the surface of the semiconductor wafer 20 to be pressed, and a transfer in the horizontal direction, in which the pressing member 30 is scanned on a surface of the semiconductor wafer 20. That is, a device for manufacturing the light-emitting elements includes the pressing member 30 and the scanning controller 33 that controls the transfer of the pressing member 30.

The case where the side of the semiconductor wafer 20 is fixed, and the side of the pressing member 30 is transferred has been described in the example above. However, the transfer of the semiconductor wafer and the pressing member can be a relative transfer, and for example, it may be such that the pressing member is fixed, and the semiconductor wafer is transferred. Furthermore, the present disclosure is not limited to a mode in which any one of the semiconductor wafer and the pressing member is fixed, but relative transfer between the semiconductor wafer and the pressing member may be achieved by transferring both of the semiconductor wafer and the pressing member. For example, it may be constituted such that transfer is divided into X, Y, and Z directions, and the transfer in a X-Y plane is performed by the pressing member, and the transfer in the Z direction is performed by the semiconductor wafer.

Pressing Member 30

Figure 13A:
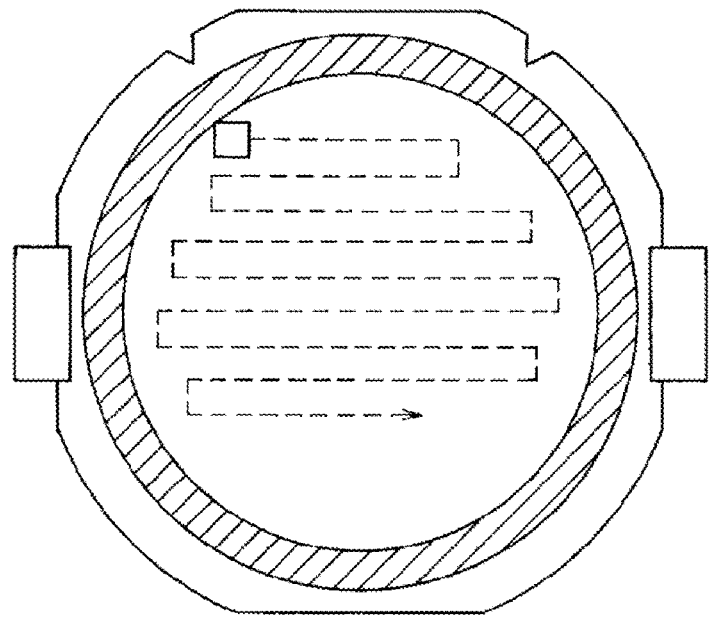
FIGS. 13A and 13B are schematic plan views illustrating a background cleaving method.
Figure 13B:
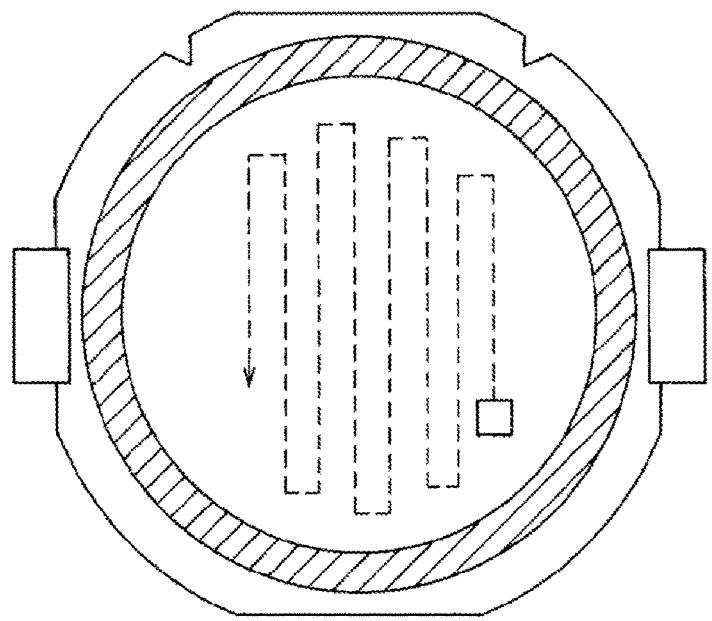

In the pressing member 30, the tip portion 31 to be pressed against the semiconductor wafer 20 is a curved surface. With this arrangement, while stress acts on the cleavage starting portion 22, damage on the semiconductor wafer 20 can be reduced. Also, even in the case of cleaving into the light-emitting elements each having a polygonal shape, it is possible to efficiently cleave the semiconductor wafer 20. That is, in the case where the light-emitting elements has a quadrangular shape as in background arts, the scribe line drawn on the semiconductor wafer is linearly formed, and therefore, as illustrated in FIGS. 13A and 13B, breaking of the wafer can be performed along the linear scribe line. However, in the case where the scribe line is bent as illustrated in FIG. 5, the breaking may not easily be performed. For example, in the case where a cleaving member that linearly cleaves an object, such as a break blade, is used, a dice might be damaged when portions other than the scribe line are pressed. In the case where the semiconductor wafer is pressed with the break blade, it may be necessary to predetermine a damage area and linearly cleave the semiconductor wafer, or carefully position a small blade, the size of which is the same as that of the dice.

Accordingly, as described above, the tip portion 31 of the pressing member 30 has a curved surface. When the semiconductor wafer 20 is pressed with this tip portion 31 having a curved surface, which has a convex shape facing the side of the semiconductor wafer 20, the semiconductor wafer 20 is warped and cleaved. With this manner, the necessity of the exact positioning of the pressing member as in background techniques can be eliminated. Furthermore, even in the case where the scribe line, that is, the cleavage starting portion 22, is bent in a plan view, the semiconductor wafer can be cut into individual pieces having a shape corresponding to the cleavage starting portion 22 without providing the damage area, and cleaving of the semiconductor wafer into the polygonal light-emitting elements can be efficiently performed.

For example, stainless steel or zirconia can be used for the materials of the pressing member 30. Also, it is preferable that the tip portion 31 of the pressing member 30 has a curved surface. Accordingly, while stress acts on the cleavage starting portion 22, damage on the semiconductor wafer 20 can be avoided. It is preferable that the tip portion 31 of the pressing member 30 have a spherical surface. It is noted that, in the present specification, the "spherical surface" does not mean the entire surface of a spherical body, but means a portion of the spherical body. For example, in order that the tip portion 31 of the pressing member 30 has the spherical surface, the shape of the tip portion 31 can be a semispherical shape. Also, the tip portion 31 may be constituted of a spherical body. For example, it may be such that the spherical body is fixed on a holder, and the semiconductor wafer 20 is pressed with the spherical body. By use of the tip portion 31 having a spherical surface, the semiconductor wafer 20 can be pressed in an area whose shape is similar to a point. The shape of the tip portion 31 may be an elliptical surface except for the spherical surface.

In the present embodiment, the outer diameter $D_1$ of the tip portion 31 is longer than the diameter of the circumscribed circle of the shape of the light-emitting element in a plan view. Preferably, the outer diameter $D_1$ of the tip portion 31 is two times as long as the diameter of the circumscribed circle of the shape of the light-emitting element in a plan view or more. Also, the outer diameter $D_1$ of the tip portion 31 is, for example, less than the diameter of the semiconductor wafer 20.

Figure 7:
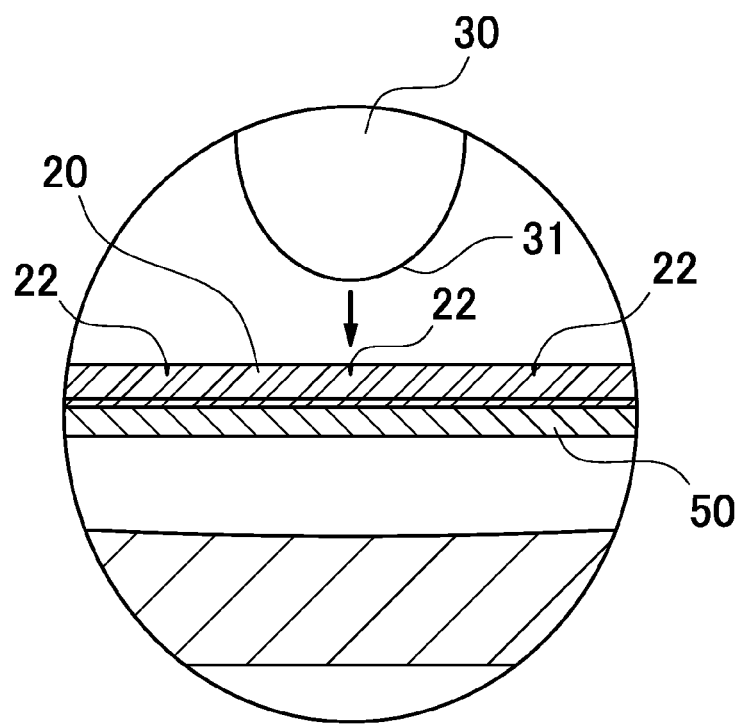
FIG. 7 is a schematic enlarged cross-sectional view of a main part in FIG. 6.
Figure 8:
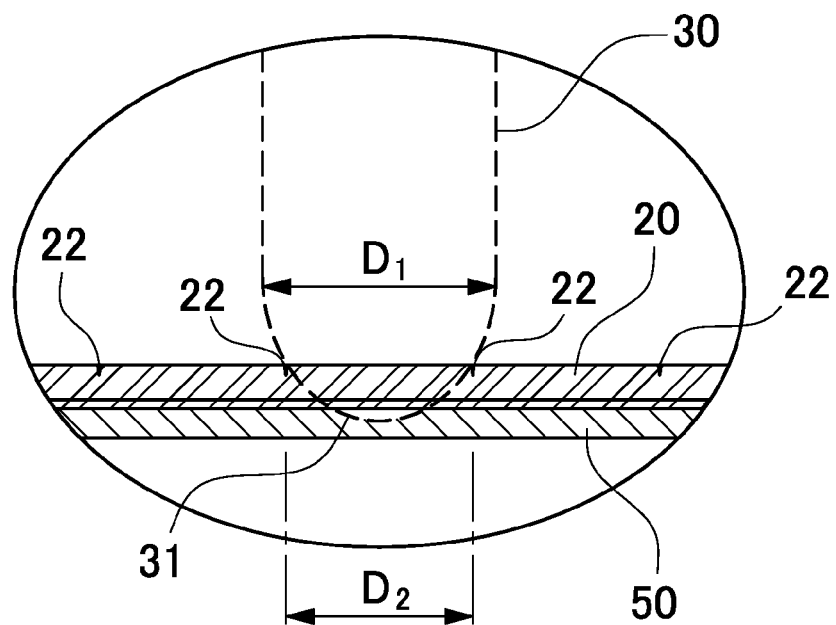
FIG. 8 is a schematic enlarged cross-sectional view of a main part illustrating a relationship between an outer diameter of a tip portion of the pressing member and the light-emitting element.
Figure 9:
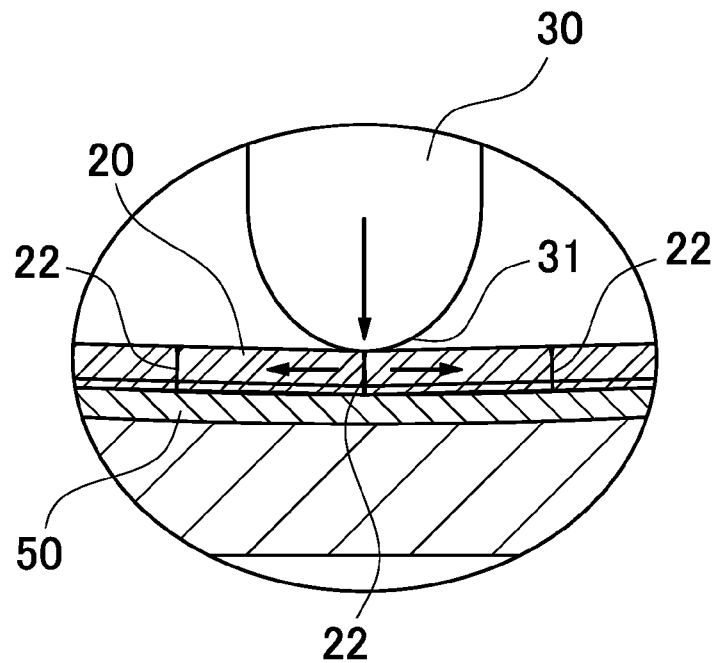
FIG. 9 is a schematic enlarged cross-sectional view of a main part illustrating a state in which a surface of the semiconductor wafer to be pressed is pressed with the tip portion of the pressing member.

It is preferable that the curvature of the tip portion 31 be larger than that of a curved surface that can press the whole of the semiconductor wafer 20 at once. That is, it is preferable that the curvature radius of the tip portion 31 be smaller than that of the curved surface that can press the whole of the semiconductor wafer 20 at once. An increase in curvature (i.e., a decrease in curvature radius) can lead to an increase in deflection of the semiconductor wafer 20, so that favorable cleaving of the semiconductor wafer 20 can be performed. The curvature radius of the tip portion 31 can be, for example, in a range of 2 to 20 mm. Also, the curvature radius of the tip portion 31 may be 2 to 25 times larger than that of one side of the shape of the light-emitting element in a plan view. Preferably, the tip portion 31 has a size that allows the tip portion 31 to simultaneously press the right and left of the cleavage starting portion 22, which are to be breaking positions, without failing when the pressing member 30 presses any portion of the main surface of the semiconductor wafer 20, as illustrated in FIGS. 7 and 8. In the case where the outer diameter $D_1$ of the tip portion 31 is smaller than the outer diameter $D_2$ of the light-emitting element, the light-emitting element only on one side of the cleavage starting portion 22 is possibly pressed, which might cause cleavage failure. Accordingly, it is preferable that the outer diameter $D_1$ of the spherical surface of the tip portion 31 be larger than the outer diameter $D_2$ of the light-emitting element. For example, in the case where the light-emitting element has a hexagon, a distance between vertices opposite to each other with respect to the center of the hexagon corresponds to the outer diameter $D_2$ of the light-emitting element. With this shape, in the case where the tip portion 31 contacts any portion of the light-emitting element, it is possible for the tip portion 31 to infallibly press an area inclusive of both sides of the cleavage starting portion 22. Then, determining the amount of indentation by the pressing member 30 so as to perform pressing in the aforementioned manner allows for performing the cleavage reliably. The outer diameter $D_1$ of the tip portion 31 can be, for example, approximately from 5 to 30 times the outer diameter $D_2$ of the light-emitting element.

The tip portion 31 refers to a portion including a surface of the pressing member 30 which can press the semiconductor wafer 20. When the pressing against the semiconductor wafer 20 is performed, it is preferable that the tip portion 31 presses the semiconductor wafer 20 at an extremely tiny area approximating to a point. With this, the cleavage can be easily performed with a small force. Also, as described above, it is preferable that the shape (the outer diameter, curvature, and the like) of the tip portion 31 and the amount of the indentation of the pressing member 30 be selected so that the two or more light-emitting elements adjacent to each other can be simultaneously pressed. With this arrangement, the pressing member 30 can be scanned in a state where the tip portion 31 continuously presses the two or more light-emitting elements, so that the cleavage can be efficiently performed. That is, in a state where the tip portion 31 presses only one light-emitting element, the pressed light-emitting element is slightly sunk and it may be difficult to perform the cleavage. Pushing two or more light emitting elements can avoid such state. Similar arrangement can be applied to the case where a protective sheet 52 described later is arranged, and the semiconductor wafer 20 is pressed in the area approximate to a point, with the pressing member 30 through the protective sheet 52.

It is preferable that the tip portion 31 of the pressing member 30 presses against the side of the back surface BS of the substrate 5 to cleave the semiconductor wafer 20. Thus, the surface of the semiconductor wafer 20 to be pressed serves as a surface that is different from the growth surface of the substrate 5, which can reduce the possibility of the damage of the semiconductor structure.

As described above, it is preferable that the cleavage starting portion 22 be formed so as to reach the surface of the semiconductor wafer 20 to be pressed. Then, as illustrated in FIG. 7, which is a schematic enlarged cross-sectional view of a main part in FIG. 6, it is preferable that semiconductor wafer 20 be pressed from the side where the cleavage starting portion 22 is provided (i.e., side of the surface where the cleavage starting portion 22 reaches). In this manner, the cleavage can be progressed from the cleavage starting portion 22 with a small amount of indentation compared with the case where the semiconductor wafer 20 is pressed from the opposite side, which can divide the semiconductor wafer 20 into the light-emitting elements. In this time, an uncut portion to be cleaved has a thickness such that the uncut portion can be cleaved with a small amount of indentation, and the thickness can be, for example, equal to or less than 150 μm, depending on a size of the light emitting element. More preferably, as described above, the cleavage starting portion 22 is formed up to near the semiconductor structure. Also, in the case where both the surface where the cleavage starting portion 22 reaches and the surface to be pressed are disposed as the back surface BS of the substrate 5, unintended damage of the semiconductor structure can be avoided, and the cleavage can be performed with good yields.

Adhesive Sheet 50

In the case where the semiconductor wafer is divided into the plurality of light-emitting elements, it is preferable that an adhesive sheet 50 be arranged on a surface that is opposite side to the surface to be pressed of the main surfaces of the semiconductor wafer 20. As illustrated in schematic cross-sectional views of FIGS. 6 and 9, the adhesive sheet 50 is applied in advance on the side of the first main surface 5a (i.e., the side where the semiconductor structure 11 of the semiconductor wafer 20 is arranged) of the substrate 5 and set on the upper surface of a receiving plate 40. With this arrangement, the semiconductor wafer 20 is pressed against the adhesive sheet 50 with the pressing member 30, which allows singulated light-emitting elements to be less likely to scatter. Also, pressing the semiconductor wafer 20 against the adhesive sheet 50 can warp the semiconductor wafer 20 with use of the repulsive force of the adhesive sheet 50. Accordingly, it is possible to cleave the semiconductor wafer 20 in midair without pressing the semiconductor wafer 20 against the surface of the receiving plate 40 including a recess.

Such application of the adhesive sheet 50 may be performed prior or subsequent to the formation of the cleavage starting portion 22, but is performed before the cleavage. In the case where the cleavage starting portion 22 reaches the vicinity of the semiconductor structure, it is preferable that the adhesive sheet 50 be applied prior to the formation of the cleavage starting portion 22, because if the adhesive sheet 50 is applied subsequent to the formation of the cleavage starting portion 22, the semiconductor wafer 20 might be unintendedly singulated, and the light-emitting elements might scatter.

Receiving Plate 40

Figure 6:
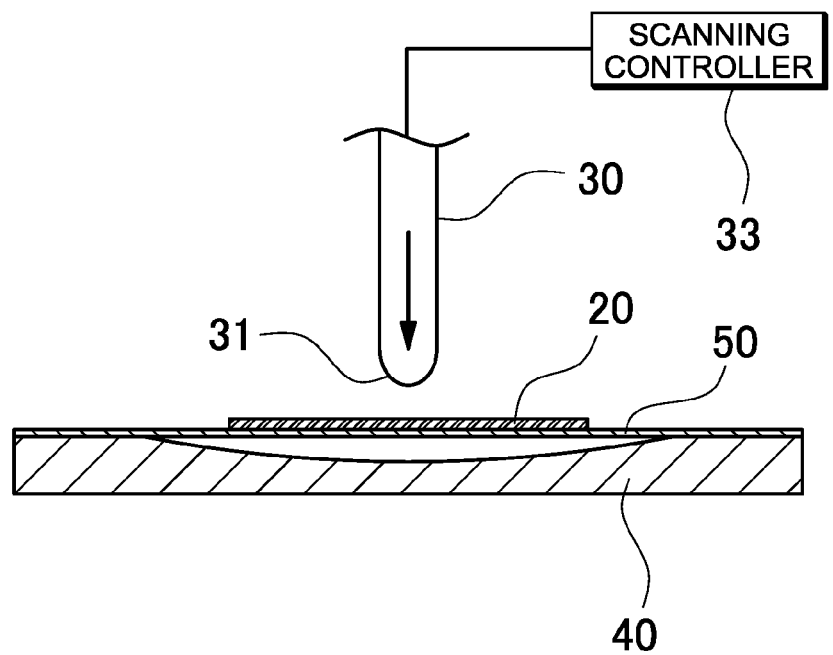
FIG. 6 is a schematic cross-sectional view illustrating a situation in which the semiconductor wafer is cleaved with a pressing member.

In the example of FIG. 6, the semiconductor wafer 20 on which the adhesive sheet 50 is applied and including the cleavage starting portion 22 is arranged on the receiving plate 40. Herein, the adhesive sheet 50 is arranged on the surface of the receiving plate 40 in advance, and in this state, the adhesive sheet 50 is applied on the semiconductor wafer 20 so that the side on which the cleavage starting portion 22 is formed corresponds to the surface to be pressed, that is, so that the side of the growth surface of the semiconductor structure faces the adhesive sheet 50, which allows for arrangement of the semiconductor wafer 20 on the receiving plate 40. The aforementioned receiving plate 40 can be made of, for example, stainless steel or zirconia. The diameter of the receiving plate 40 is selected to be larger than the outer diameter of the semiconductor wafer 20. Such diameter allows the semiconductor wafer 20 to be arranged on the receiving plate 40. With the arrangement described above, the pressing member 30 is touched to the upper surface side of the semiconductor wafer 20 and pressed toward the receiving plate 40. The semiconductor wafer 20 being pressed is pressed on the surface of the receiving plate 40 via the adhesive sheet 50 and bent at the cleavage starting portion 22, which has low intensity, and therefore divided along the cleavage starting portion 22. Concurrently, the pressing member 30 is scanned on the semiconductor wafer 20 in a state where the surface of the semiconductor wafer 20 to be pressed is pressed with the pressing member 30, which allows for sequentially dividing the semiconductor wafer 20 arranged on the receiving plate 40 into elements. The receiving plate 40 has a shaped depressed in the pressing direction (the downward direction in FIG. 6), and it is preferable that the depressed surface thereof be a spherical surface of which the curvature is lower than that of the tip portion 31. With this structure, the central vicinity of the tip portion 31 can be reliably pressed against the receiving plate 40. It is noted that, as described above, the semiconductor wafer 20 can be cleaved without being pressed against the surface of the receiving plate 40. In this case, the amount of indentation into the semiconductor wafer 20 by the pressing member 30 may be reduced to the extent that the semiconductor wafer 20 is not pressed against the receiving plate 40. With this arrangement, the damage of the semiconductor wafer 20 can be reduced.

A base on which the semiconductor wafer 20 is arranged is not limited to the receiving plate including the depression as illustrated in FIG. 6, but, for example, the semiconductor wafer 20 may be arranged on the upper surface of a flat base. In this case, cleaving the semiconductor wafer 20 with a relatively low amount of indentation is preferable because it can reduce the damage of the semiconductor wafer.

Protective Sheet 52

When the semiconductor wafer 20 is divided into the light-emitting elements, the protective sheet 52 may be arranged on the side of the surface to be pressed of the main surfaces of the semiconductor wafer 20. Such arrangement of the protective sheet 52 can prevent the pressing member 30 from directly contacting the semiconductor wafer 20. Accordingly, damage of the semiconductor wafer 20 caused by the pressing member 30 can be prevented, and damage of the tip portion 31 caused by the fragment of the semiconductor wafer 20 also can be prevented. Furthermore, the lifting of the semiconductor wafer 20 at the time of being pressed can be prevented, so that the effect of easy cleaving of the semiconductor wafer 20 can be expected. Also, in the case where a material having a low coefficient of dynamic friction is employed for the protective sheet 52, the pressing member 30 can be smoothly slid on the semiconductor wafer 20.

Figure 10:
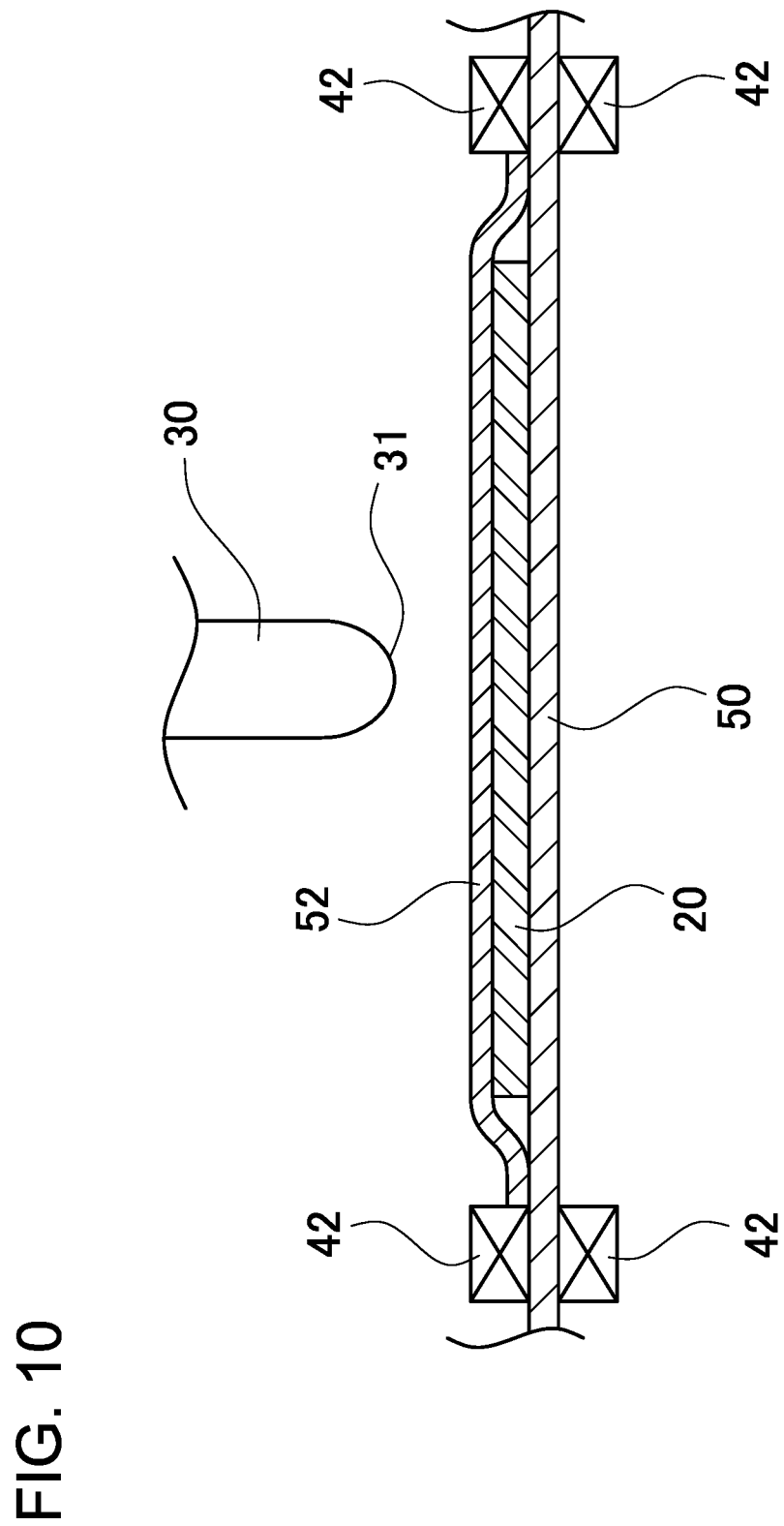
FIG. 10 is a schematic cross-sectional view of a state in which the semiconductor wafer is set on a ring-shaped frame according to variant example.

An example of arranging the protective sheet 52, as described above, is illustrated in a schematic cross-sectional view in FIG. 10 as a variant example. As illustrated in this figure, the protective sheet 52 is arranged on the side of the surface to be pressed on the semiconductor wafer 20, and the semiconductor wafer 20 is set in a ring-shaped frame 42 in a state where the adhesive sheet 50 is applied on the back surface BS of the semiconductor wafer 20. The size of the protective sheet 52 is large enough to cover the whole of the semiconductor wafer 20. Also, the protective sheet 52 is not required to be applied on the surface to be pressed, but may be applied on the adhesive sheet 50 in the periphery of the semiconductor wafer 20 in a state where the semiconductor wafer 20 and the protective sheet 52 are overlapped. Also, for another mode, the protective sheet 52 may be clamped with the ring-shaped frame 42 along with the adhesive sheet 50. For the protective sheet 52, sheet members made of resin, for example, made of PET, can be employed.

The ring-shaped frame 42 is formed in a frame shape in which the central portion is opened so as to hold only the periphery of the semiconductor wafer 20. With such structure, the receiving plate for receiving the tip portion of the pressing member can be eliminated. However, as is the same with FIG. 6 described above, the receiving plate can be arranged at a downward position corresponding to the tip portion of the pressing member. In this case, the semiconductor wafer is held by the ring-shaped frame 42, so that it is not necessary to hold the semiconductor wafer by the receiving plate, and the size of the receiving plate may be reduced in accordance with the size of the tip portion 31 of the pressing member.

Scanning Pattern SP of Pressing Member 30

The pattern of scanning the pressing member 30 on the plane of the semiconductor wafer 20 during the cleavage is preferably formed such that the pressing member 30 is transferred in the direction intersecting with the entire straight lines including line segments forming the cleavage starting portion 22 in a plan view of the semiconductor wafer 20. In other words, the pressing member 30 is scanned in the direction that is not parallel to any side forming the polygon, which is the outer shape of each light-emitting element. Such scanning has an advantage that cleaving to obtain one light-emitting element can be accomplished by one-time scanning on one light-emitting element using the pressing member 30. More specifically, in the case where the semiconductor wafer is cleaved into the background, rectangular light-emitting elements, scanning methods in which the pressing member is scanned in the longitudinal direction or the lateral direction as illustrated in FIGS. 13A and 13B have been used. However, these methods require scanning a plurality of times. In contrast, in the present embodiment, in order to perform cleaving to obtain one light-emitting element, scanning of only one time on one light-emitting is required. This is because, in the background cleaving method, the pressing member is scanned along a break line (scribe line), and the break line is arranged in a lattice pattern, so that the scanning in the longitudinal direction and the lateral direction is necessary. If this background method is applied to the polygonal light-emitting elements, for example, hexagonal light-emitting elements in the present embodiment, the pattern of each cleavage starting portion is a polygonal line, which may highly complicate the scanning pattern. Accordingly, in the present embodiment, the pressing member 30 is scanned, intentionally, not along the a line segment of the cleavage starting portion 22. Conversely, as illustrated on the enlarged cross-sectional view in FIG. 11, the pressing member 30 is scanned in the direction obliquely intersecting with the line segment of the cleavage starting portion 22 in a plan view. In this manner, stress is applied to the line segment forming the cleavage starting portion 22 arranged in various directions and angles, which allows for cleaving the semiconductor wafer 20 at once. In particular, the tip portion 31 of the pressing member 30 is not a surface including edges, but a curved surface, which can easily disperse the stress from a point of application and reduce the risks that the semiconductor wafer is cleaved in unintended directions at a location away from the cleavage starting portion 22. In this method, it is not necessary to scan the pressing member 30 exactly along the break line as in the background method, and therefore the control of scanning can be facilitated. Moreover, reducing the number of times of scanning can lead to reduction in takt time and can contribute to reduction in manufacturing costs of the light-emitting elements.

Figure 11:
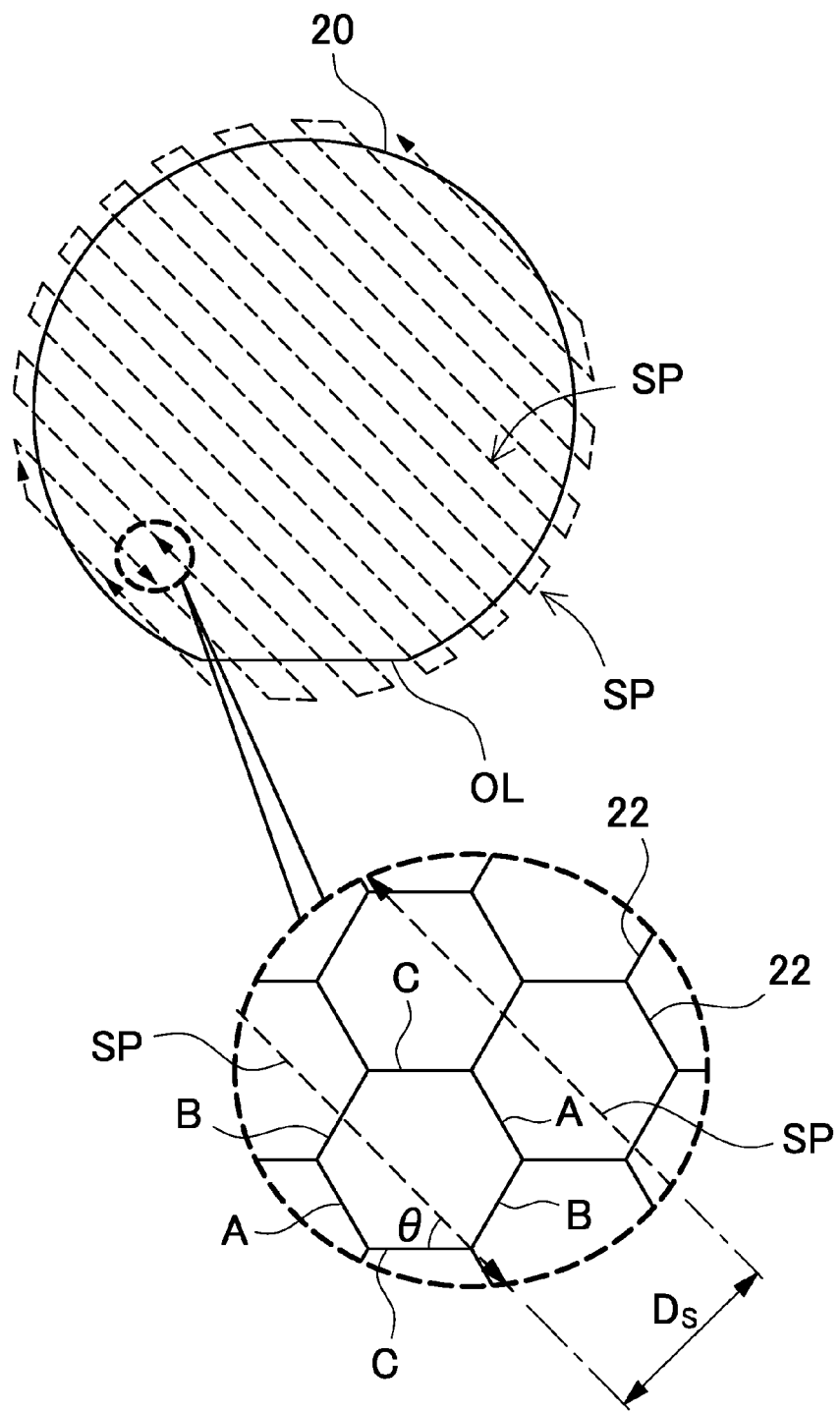
FIG. 11 is a schematic plan view illustrating a scanning pattern in which the pressing member is scanned on the semiconductor wafer.

The direction of scanning the pressing member 30 can be, as illustrated in FIG. 11, for example, the direction that is inclined to the orientation flat surface OL of the semiconductor wafer 20. In this case, the inclination angle $\theta$ at which the pressing member 30 is scanned with respect to the orientation flat surface OL, is selected to be an angle that is not parallel to any side forming the outer shape of the light-emitting element, that is, an angle at which the scanning direction intersects with any side forming the outer shape of the light-emitting element. For example, in the example in FIG. 11, the outer shape of the light-emitting element is a regular hexagon, and one side (a side C in the diagram) of the regular hexagon is arranged to be in parallel with the orientation flat surface OL. Accordingly, when the pressing member 30 is scanned at an angle of 60 degrees with respect to the orientation flat surface OL, the scanning direction corresponds to the side A. As a result, stress concentrates on the side A, and while it is expected that the cleavage is sufficiently performed in this portion, it is considered that the stress of cleavage is relatively reduced in portions corresponding to other sides, which may cause unevenness in quality of the cleaved surfaces. Similarly, in the case where the pressing member 30 is scanned at an angle of 120 degrees with respect to the orientation flat surface OL, the scanning direction corresponds to the side B. Furthermore, in the case where the pressing member 30 is scanned at an angle of zero degrees with respect to the orientation flat surface OL, that is, the scanning direction is not inclined, but in parallel with the orientation flat surface OL, the scanning direction corresponds to the side C. Accordingly, in the example of FIG. 11, the inclination angle $\theta$ at which the pressing member 30 is scanned with respect to the orientation flat surface OL, is selected to be an angle except for 0, 60, and 120 degrees.

In addition to the direction passing directly above each side of the polygon, the direction passing vertically to the each side is considered to be a pressing direction in which the semiconductor wafer 20 is easily cleaved. Accordingly, more preferably, the inclination angle of the pressing direction is determined so as to avoid the direction vertically intersecting with each side. In the example in FIG. 11, in the case where the inclination angle $\theta$ is 30 degrees, the pressing direction is perpendicular to the side B, and in the case where the inclination angle $\theta$ is 90 degrees, the pressing direction is perpendicular to the side C, and in the case where the inclination angle $\theta$ is 150 degrees, the pressing direction is perpendicular to the side A. Accordingly, it is preferable that the inclination angle θ not be 30, 90, or 150 degrees. In other words, in the case where the light-emitting element has a shape of a regular hexagon, it is preferable that the inclination angle θ of the scanning direction of the pressing member 30 is selected to be an angle that excludes a multiple of 30 degrees with respect to the orientation flat surface OL. In view of this, more preferably, the inclination angle θ is selected from the vicinity of angles of 15, 45, 75, 105, 135, and 165 degrees, each of which is in the middle of range of the angles excluding a multiple of 30 degrees. In this manner, uniform stress is applied to each side of the regular hexagon of the shape of the light-emitting element, and therefore it is expected that quality in the cleaved surface of each side is uniformed. In the example illustrated in FIG. 11, the inclination angle θ is 45 degrees.

As described above, scanning the pressing member 30 so that the scanning direction does not correspond to the direction of each side of the light-emitting element and/or the direction vertically intersecting with each side of the light-emitting element can uniform easiness of cleavage of each side. As a result, the state of cleavage in the surface of the semiconductor wafer can be uniformed.

It is preferable that intervals $D_S$ between scanning patterns SP be selected so that all the light-emitting elements included in the semiconductor wafer 20 are singulated. An area being pressed by one-time linear scanning is determined in accordance with the shape and the amount of indentation by the tip portion 31, in view of which the intervals $D_S$ between the scanning patterns SP can be selected. It is preferable that the intervals $D_S$ between the scanning patterns SP be equal to or less than the maximum width of the area that the tip portion 31 can press, and more preferably less than the maximum width of the area that the tip portion 31 can press. The scanning patterns SP of the pressing member 30 refer to a locus through which the center of the tip portion 31 passes.

In the description above, the case in which the orientation flat surface OL and one of sides of the light-emitting element are parallel to each other has been exemplified. With the aforementioned arrangement, the scanning direction can be defined based on the orientation flat surface OL. However, the present disclosure is not limited to this. For example, all sides of the light-emitting element in plan view are not parallel to the orientation flat surface OL. In this case, similarly to the example described above, it is preferable that the pressing member 30 scans on the semiconductor wafer at an angle at which the scanning direction intersects with all the straight lines including the sides of the light-emitting element, and more preferably, the pressing direction is selected so that the scanning direction does not correspond to the direction vertically intersecting with each side of the light-emitting element.

Extracting Light-Emitting Element

After the light-emitting elements are divided, each light-emitting element is taken out in Step S24 in FIG. 2. In the example illustrated in the cross-sectional view in FIG. 10, each light-emitting element is held in a state of being stuck with the adhesive sheet 50. With this arrangement, from a state where each light-emitting element has cleaved along the cleavage starting portion 22, each light-emitting element is separated from the adhesive sheet 50, so that singulated light-emitting element can be obtained.

Second Embodiment

In the first embodiment described above, the scanning pattern SP of the pressing member 30 is constituted of linear transfer of the pressing member 30. That is, as illustrated in FIG. 11, the pressing member 30 is reciprocated in the direction inclined at the inclination angle θ with respect to the orientation flat surface OL of the semiconductor wafer 20. However, the locus of scanning of the pressing member 30 is not limited to this, but the scanning patterns, with which any area corresponding to each light-emitting element can be pressed, may be employed. For example, the pressing member 30 can be scanned in a spiral form such that a circle is drawn from the central portion to the outer circumferential portion of the semiconductor wafer.

Figure 12:
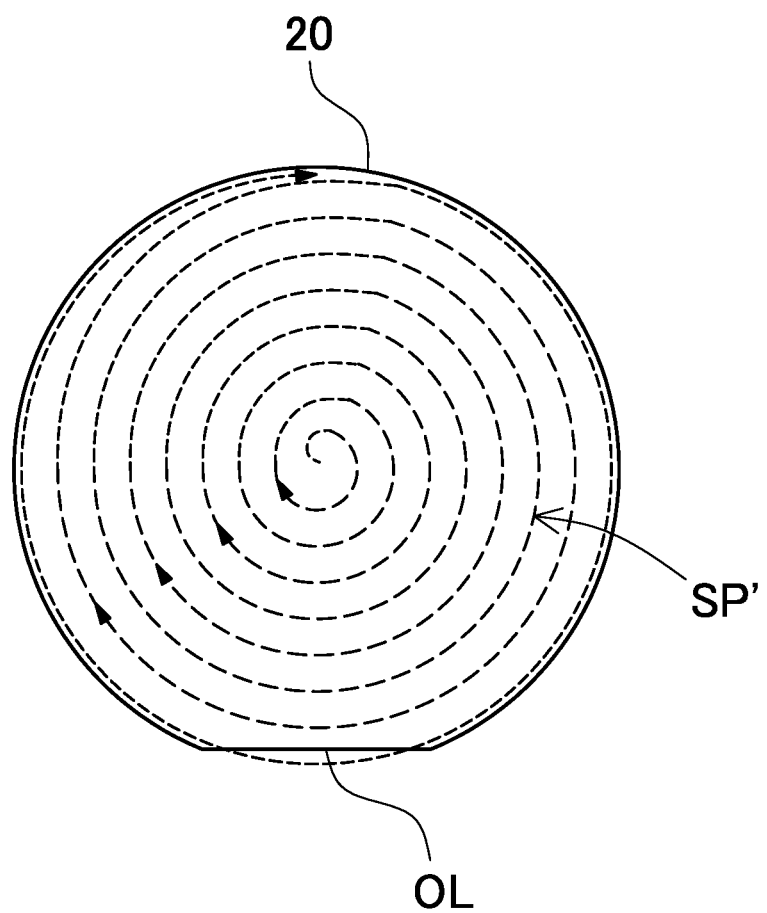
FIG. 12 is a schematic plan view illustrating a scanning pattern according to a second embodiment, in which the pressing member is scanned on the semiconductor wafer.

A method for manufacturing the light-emitting element according to a second embodiment, the example of a pattern SP', in which the pressing member is scanned in a spiral form, is illustrated in a schematic plan view in FIG. 12. This method has an advantage that control of transfer of the pressing member can be successively and smoothly performed, compared with the case where the pressing member is linearly transferred as illustrated in FIG. 11. That is, in the case of the scanning patterns SP in which the pressing member is linearly transferred as illustrated in FIG. 11, the pressing member is temporarily stopped at the start point and the end point of the straight line, and accordingly the cycle of stopping and moving is repeated. Accordingly, due to inertia, the transfer velocity of the pressing member is reduced in the vicinity of a position at which the pressing member stops, which leads to the non-uniformity of scanning velocity at each section. Accordingly, the transfer velocity of the pressing member is relatively reduced in the vicinity of the position at which the pressing member stops, which leads to a state where the semiconductor wafer is pressed in a longer time. In other words, it is considered that, at a portion near the periphery of the semiconductor wafer, where the pressing member is stopped, unevenness in the results of the cleavage occurs compared with the central region of the wafer. In contrast, in the case of the pattern SP', in which the pressing member is scanned in a spiral form, the pressing member is easily transferred in a continuous manner, and the scanning velocity can be easily approximated to a constant velocity. Accordingly, an advantage that uniform pressing pressure can be applied to each light-emitting element can be obtained, and the takt time can be reduced.

Thus, the scanning pattern of the pressing portion is not limited to the linear form, but the curved line can be employed. That is, the pressing portion is scanned on the surface of the semiconductor wafer 20 in a single movement, which can form the scanning pattern in which the locus of scanning is included in any area corresponding to each light-emitting element. It is noted that the second embodiment is similar to the first embodiment except for the difference in the scanning patterns of the pressing member.

The embodiments, examples, and modifications of the present disclosure have been described based on the drawings above. However, the embodiments or examples, and modifications described above are provided for the purpose of embodying the technical concept disclosed in the present disclosure, and the present disclosure is not limited to the descriptions above. Also, in the present specification, the members disclosed in the claims are not limited to the members specified in the embodiments. Unless otherwise specifically stated, the scope of the present disclosure is not limited to the descriptions in the embodiments, and in particular, size, material, shape, and relative arrangement of members described in the embodiments are given as examples. It is noted that the sizes or positional relation of respective members illustrated in each diagram may be exaggerated so as to clarify the descriptions. Furthermore, in the description above, the same designations or the same reference numerals denote the same or similar member, and its detailed description is appropriately omitted. In addition, a plurality of structural elements of the present disclosure may be configured as a single part which serves the purpose of a plurality of elements; on the other hand, a single structural element may be configured as a plurality of parts which serve the purpose of a single element.

The light-emitting element obtained by the method described above can be utilized for light sources for illuminating devices, LED displays, light sources for backlight, traffic signal devices, lighting switches, various display devices such as advertisements or destination guide, image reading devices such as digital video cameras, facsimile machines, copying machines, and scanners, projector devices, or the like. The method described above can be applied to not only the semiconductor light-emitting elements such as LEDs used for various sensors and indicators, but also to the manufacturing of other semiconductor elements, for example, such as light receiving elements and amplifier elements.

What is claimed is:

1. A method for manufacturing a semiconductor element, comprising:
    providing a semiconductor wafer including a substrate, a semiconductor structure on the substrate, and electrodes;
    forming a cleavage starting portion in the semiconductor wafer, without dividing the semiconductor structure; and
    dividing the semiconductor wafer into a plurality of semiconductor elements by transferring a pressing member on the semiconductor wafer in a state where the pressing member is pressed against the semiconductor wafer before separating the semiconductor structure, thereby the semiconductor wafer is separated at the cleavage starting portion, wherein
        the pressing member includes a tip portion to be pressed on the semiconductor wafer,
        the tip portion has a spherical surface, and
        each of the plurality of semiconductor elements has a shape of a polygon having five or more angles in a plan view.

2. The method for manufacturing the semiconductor element according to claim 1, wherein the dividing the semiconductor wafer into the semiconductor elements comprises scanning the pressing member on the semiconductor wafer in a direction that is not parallel to any side forming an outer shape of the polygon of each semiconductor element in the plan view.

3. The method for manufacturing the semiconductor element according to claim 2, wherein the dividing the semiconductor wafer into the semiconductor elements comprises scanning the pressing member linearly.

4. The method for manufacturing the semiconductor element according to claim 1, wherein the dividing the semiconductor wafer into the semiconductor elements comprises scanning the pressing member on the semiconductor wafer in a direction inclined with respect to an orientation flat surface of the semiconductor wafer in the plan view.

5. The method for manufacturing the semiconductor element according to claim 1, wherein an outer shape of the tip portion is longer than a diameter of a circumscribed circle of the shape of the semiconductor element in the plan view.

6. The method for manufacturing the semiconductor element according to claim 5, wherein the outer shape of the tip portion is two times or more as long as the diameter of the circumscribed circle of the shape of the semiconductor element in the plan view.

7. The method for manufacturing the semiconductor element according to claim 1, wherein, before the dividing the semiconductor wafer into the semiconductor elements, the cleavage starting portion reaches a surface of the semiconductor wafer to be pressed with the pressing member.

8. The method for manufacturing the semiconductor element according to claim 1, wherein, before the dividing the semiconductor wafer into the semiconductor elements, the cleavage starting portion is formed to reach a surface of the substrate on a side opposite to a surface of the substrate on which the semiconductor structure is formed.

9. The method for manufacturing the semiconductor element according to claim 8, wherein, before the dividing the semiconductor wafer into the semiconductor elements, the cleavage starting portion is formed up to be substantially near the semiconductor structure on the substrate.

10. The method for manufacturing the semiconductor element according to claim 1, wherein, in the dividing the semiconductor wafer into the semiconductor elements, a surface of the semiconductor wafer, on an opposite side with respect to a surface of the semiconductor wafer to be pressed with the pressing member, is fixed to an adhesive sheet.

11. The method for manufacturing the semiconductor element according to claim 10, wherein, in the dividing the semiconductor wafer into the semiconductor elements, the semiconductor wafer is cut and separated at the cleavage starting portion in midair and divided into the individual semiconductor elements.

12. The method for manufacturing the semiconductor element according to claim 1, wherein the cleavage starting portion is formed in a bent polygonal line in the plan view.

13. The method for manufacturing the semiconductor element according to claim 1, wherein the cleavage starting portion is formed by focusing a laser beam in an interior of the substrate.

14. The method for manufacturing the semiconductor element according to claim 1, wherein
    the substrate has a crystal structure of a hexagonal crystal system, and
    the shape of each semiconductor element in the plan view is a hexagon.

15. The method for manufacturing the semiconductor element according to claim 1, wherein the dividing the semiconductor wafer into the semiconductor elements comprises scanning the pressing member on the semiconductor wafer so as to reciprocate in a direction inclined with respect to an orientation flat surface of the semiconductor wafer in the plan view.

16. A method for manufacturing a semiconductor element, comprising:
    providing a semiconductor wafer including a substrate and a semiconductor structure on a first main surface of the substrate;
    forming a cleavage starting portion in the semiconductor wafer, the cleavage starting portion being formed to reach a second main surface of the substrate on an opposite side with respect to the first main surface, without dividing the semiconductor structure; and
    dividing the semiconductor wafer into a plurality of semiconductor elements by transferring a pressing member on the semiconductor wafer in a state where the pressing member is pressed on the second main surface before separating the semiconductor structure, thereby the semiconductor wafer is separated at the cleavage starting portion, wherein the pressing member includes a tip portion to be pressed on the semiconductor wafer, the tip portion has a curved surface, and each of the plurality of semiconductor elements has a shape of a polygon having five or more angles in a plan view.

17. A method for manufacturing a semiconductor element, comprising:

providing a semiconductor wafer including a substrate and a semiconductor structure on the substrate;

forming a cleavage starting portion in the semiconductor wafer; and dividing the semiconductor wafer into a plurality of semiconductor elements, each semiconductor element having a shape of a polygon having five or more angles in a plan view, by transferring a pressing member on the semiconductor wafer so that the pressing member scans linearly in a direction that is not parallel to any side forming an outer shape of the polygon of each semiconductor element, in a state where the pressing member is pressed against the semiconductor wafer to separate the semiconductor wafer at the cleavage starting portion, wherein the pressing member includes a tip portion to be pressed on the semiconductor wafer, and the tip portion has a curved surface.

* * * * *